United States Patent [19]

Blake et al.

[11] Patent Number: 5,436,790
[45] Date of Patent: Jul. 25, 1995

[54] WAFER SENSING AND CLAMPING MONITOR

[75] Inventors: Julian G. Blake, Beverly Farms; Weilin Tu, Natick; Dale K. Stone, Haverhill; Scott C. Holden, Manchester, all of Mass.

[73] Assignee: Eaton Corporation, Cleveland, Ohio

[21] Appl. No.: 5,030

[22] Filed: Jan. 15, 1993

[51] Int. Cl.6 .................................. H02N 13/00
[52] U.S. Cl. .................................. 361/234
[58] Field of Search ............... 361/230, 233, 234, 235;
437/8; 324/713, 715, 718, 724, 158 F, 158 P;
279/126, 128; 29/900; 248/309.3, 309.4; 269/8, 903

[56] References Cited

U.S. PATENT DOCUMENTS

| | | |
|---|---|---|
| 4,184,188 | 1/1980 | Briglia . |
| 4,384,918 | 5/1983 | Ahi . |
| 4,665,463 | 5/1987 | Ward et al. . |
| 4,692,836 | 9/1987 | Suzuki .................. 361/234 |
| 4,751,609 | 6/1988 | Kashahara . |
| 4,864,461 | 9/1989 | Kashara . |
| 4,962,441 | 10/1990 | Collins . |
| 5,103,367 | 4/1992 | Horwitz et al. . |
| 5,173,834 | 12/1992 | Sogoh . |
| 5,315,473 | 5/1994 | Collins et al. .......... 361/234 |
| 5,325,261 | 6/1994 | Horwitz ................ 361/234 |

FOREIGN PATENT DOCUMENTS

0460954A1 12/1991 European Pat. Off. .
0552877A1 7/1993 European Pat. Off. .

Primary Examiner—A. D. Pellinen
Assistant Examiner—Fritz M. Fleming
Attorney, Agent, or Firm—Watts, Hoffmann, Fisher & Heinke

[57] ABSTRACT

A wafer position and clamp sensor. A circuit monitors capacitance between two electrodes within a wafer support. With no wafer on the support, the capacitance falls in one range, with the wafer in place but not clamped, the capacitance falls in a second range and with the wafer held in place by an electrostatic attraction the capacitance falls in a third range. The sensed capacitance is converted to a frequency and then a DC voltage level that can easily be sensed and used to confirm wafer placement and then confirm wafer clamping.

9 Claims, 5 Drawing Sheets

WAFER SENSING AND CLAMPING MONITOR

FIELD OF THE INVENTION

The present invention concerns method and apparatus for holding a semiconductor wafer against a wafer support and more particularly to method and apparatus for monitoring operation of such apparatus.

BACKGROUND ART

U.S. Pat. No. 5,103,367, entitled *Electrostatic Chuck Using AC Field Excitation* relates to a mechanism for holding semiconductor wafers in contact with a support during treatment of the wafers. The '367 patent discloses three electrodes, two of which define a substantially planar surface and are embedded within a thin dielectric film. These two electrodes are excited by a low-frequency AC supply to produce sine wave fields of controlled amplitude and phase. The third electrode provides a reference point for the other two electrodes. By controlled rates of voltage application and removal, low-voltage gradients are obtained on the wafer support. This results in no retentive forces between the dielectric medium and the wafer. A low alternating current amplitude excitation of the chuck enables capacitative current sensing of the relative positions of the wafers and the dielectric film enabling simple control of voltage application to the electrodes.

DISCLOSURE OF THE INVENTION

The present invention concerns a method and apparatus for securing a silicon wafer to a wafer support. The presence of the silicon wafer on the support is sensed by measuring the capacitance between two electrodes attached to the support. Once the measured capacitance between the two electrodes reaches a value indicating a wafer has been placed on the support, the wafer is secured to the support by creating an electrostatic attraction between the wafer and the support. A change in capacitance between the two electrodes as the electrostatic attraction is created is used as a check to make sure the wafer has been secured to the support by the electrostatic attraction.

Apparatus constructed in accordance with one embodiment of the invention secures a silicon wafer to a wafer support and includes a wafer support including two electrodes for attracting wafers to the wafer support by means of an electrostatic attraction. Capacitance monitoring circuitry coupled to the electrodes monitors a capacitance between the two electrodes. A power supply energizes the two electrodes. A controller applies energization signals from the power supply to the two electrodes, thereby attracting the wafer to the wafer support once a wafer has been placed into the wafer support. The controller includes an input coupled to an output from the capacitance monitoring circuitry to determine a presence of the wafer on the wafer support.

More particularly, an electrostatic chuck for semiconductor wafers constructed in accordance with a preferred embodiment of the invention includes a first dielectric layer engageable by a wafer; a base member supporting said first dielectric layer; first and second electrodes positioned between said first dielectric layer and said base member; and a power supply to apply a DC electric potential to the first and second electrodes to create an electrostatic attractive force between the first dielectric layer and said wafer. Capacitance sensing circuitry senses capacitance between the first and second electrodes and monitors a change in said capacitance as the wafer is placed on the first dielectric layer. The capacitance sensing circuitry also monitors a change in said capacitance as the wafer is held in place by the electrostatic attractive force.

The above and other objects, advantages and features of the invention will become better understood from detailed description of a preferred embodiment of the invention which is described in conjunction with the accompanying drawings.

BEST MODE FOR PRACTICING THE INVENTION

Figure 1:
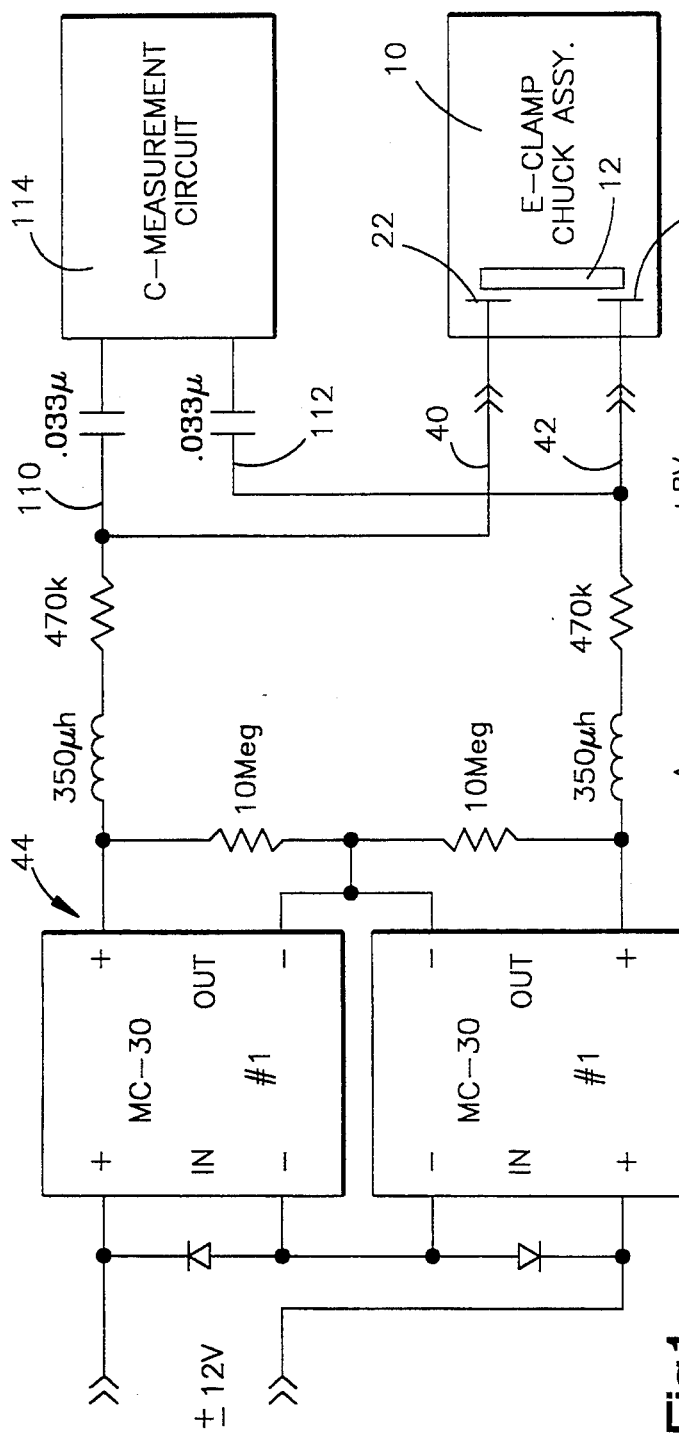
FIG. 1 is a schematic showing a power supply, electrostatic clamp assembly and capacitance measuring circuit.

The drawings illustrate a clamp assembly 10 for supporting and holding a semiconductor wafer 12 (FIG. 3) for processing. The clamp assembly 10 includes a backing plate 14 which is preferably formed of alumina or molybdenum, a base member 16 also formed of alumina, a dielectric layer 18 of glass, and a dielectric layer 20 of alumina. Electrodes 22, 24 are interposed between the glass layer 18 and the dielectric layer 20 and a heating element 26 is interposed between the glass layer and the base member 16.

A gas fitting 28 extends through the chuck assembly opening into the interface between the wafer and the layer 20 to provide gas conduction cooling between the wafer and the chuck as described in U.S. Pat. No. 4,261,762. A gas distribution groove 29 is formed in the top surface of layer 20 to aid in the distribution of the gas.

The base member 16 defines a manifold having a channel 30 for the flow of a cooling fluid. In the preferred embodiment shown, the channel is formed as a spiral; however, it can also follow a meandering path or it can be a series of interconnected channels. The channels are closed to define an enclosed conduit or conduits by means of the backing plate 14, which is sealed against the manifold. Openings are provided in the backing plate for a coolant inlet fitting 32 and a coolant outlet fitting 34. Since the present chuck assembly is intended to perform under a wide range of temperature conditions, the cooling medium flowing through the manifold can be either a liquid or a gas, depending on the application.

Clamp Construction

Figure 2:
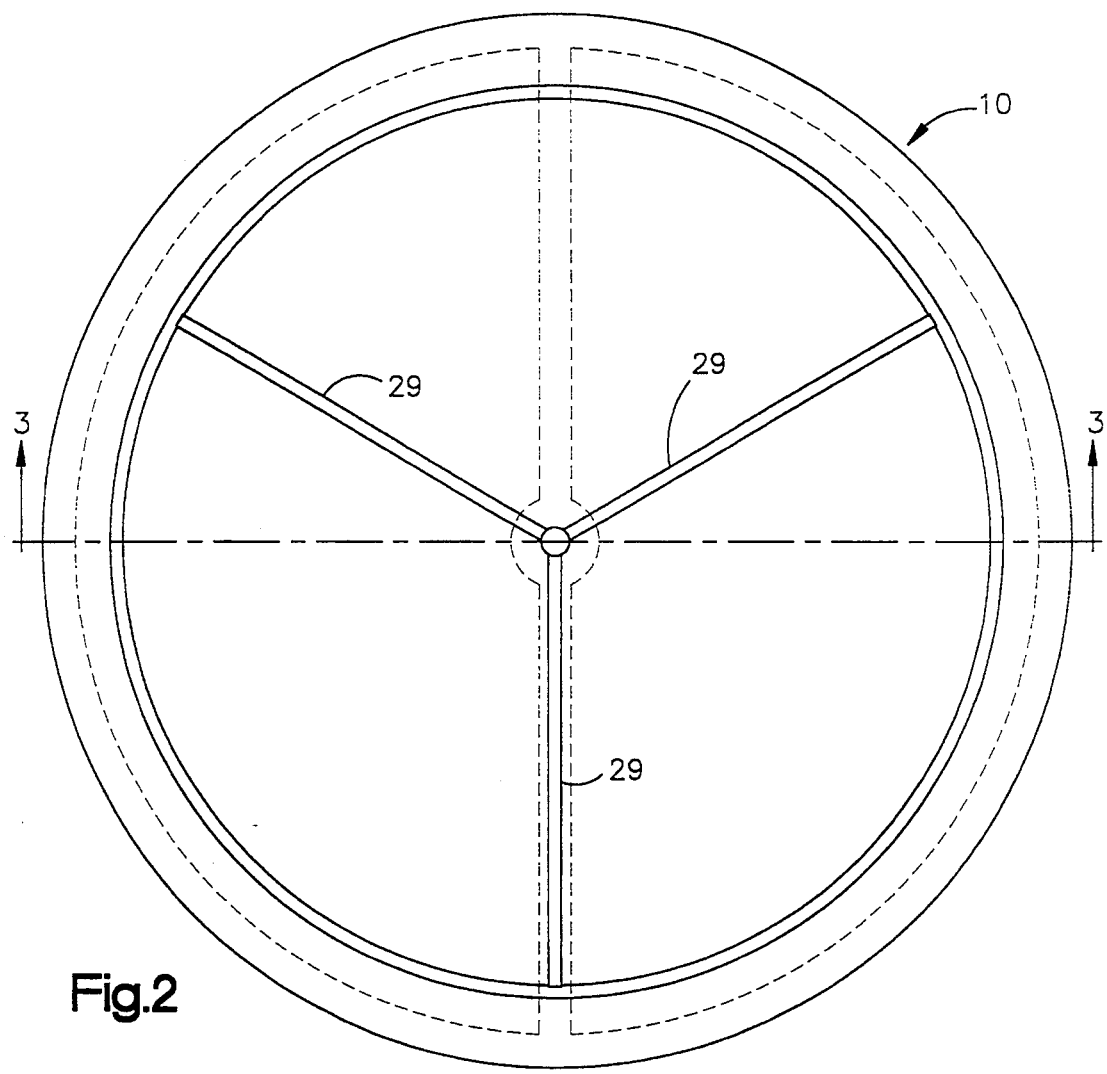
FIG. 2 is a plan view of a wafer support used in an ion implanter.

The dielectric layer 20 is preferably formed of a thin (about 0.25 mm) layer of high purity (99.5%) alumina. The electrodes 22 and 24 are then formed on the bottom (as seen in FIG. 2) surface of the dielectric layer, preferably by screen printing a paste of powdered copper aluminum or silver palladium metals and glass frit onto the dielectric layer and then firing it at about 700° C. As shown in FIG. 2, the electrodes are essentially half circular in plan view.

Figure 3:
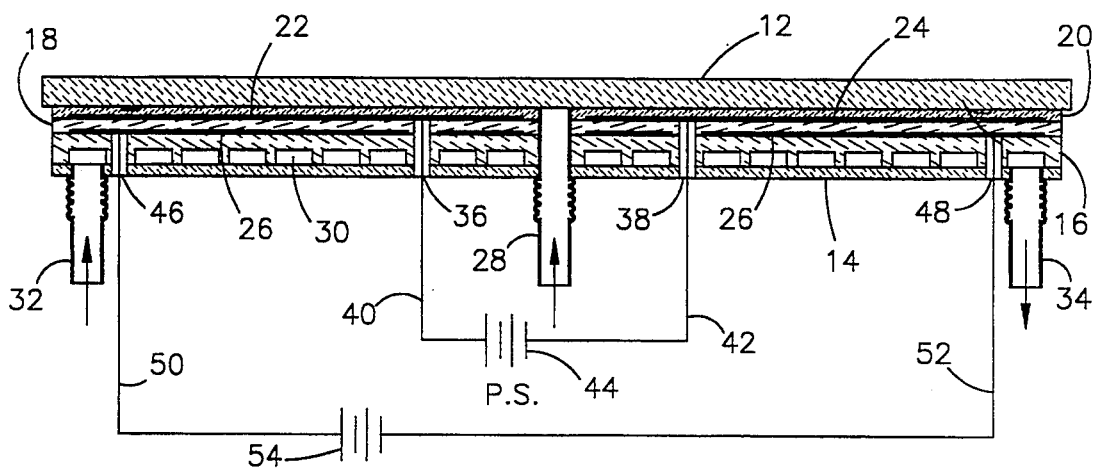
FIG. 3 is a view as seen from the plane 3—3 in FIG. 2.

The heating element 26 is formed by screen printing a paste of powdered tungsten and glass frit onto the manifold in the form of a continuous meander, the geometry of the meander preferably being as shown in FIG. 3 to provide a higher heater power density at the outer edge to optimize temperature uniformity across the chuck.

Once the electrodes 22, 24 and heating element 26 are fired onto the dielectric layer, the layer 20 is bonded to the manifold. After the above assembly is complete, the backing plate 14 is furnace brazed or sealed by means of a sealing glass to the bottom of the manifold 16.

As shown schematically in FIG. 3, access holes 36, 38 are formed through the backing plate 14, the manifold 16 and the dielectric layer 18 for a first conductor 40 connected to the electrode 22 and for a second conductor 42 connected to the electrode 24. The conductors 40, 42 are attached to the electrodes by brazing or other convenient methods such as by providing spring contacts engageable with the electrodes and are connected to a switching power supply 44 (FIG. 1) which provides a signal of about 3 kilovolts DC to create the electrostatic clamping force to a semiconductor wafer 12 placed on the surface of the dielectric layer 20.

Access holes 46, 48 are also formed through the backing plate 14 and the manifold 16 for a third conductor 50 attached to one terminal of heating element 26 also by brazing or the like, and fourth conductor 52 similarly attached to the other terminal of heating element 26 to connect the heating element to a second power source 54, typically operating at 120 volts. Preferably, the access holes 36, 38 and the hole for the gas fitting 28 are machined into the structure with the holes 36, 38 sealed with sealing glass and the fitting bonded into its hole with sealing glass.

Capacitance Sensing Circuit

As seen in FIG. 1, two inputs 110, 112 from the electrodes 22, 24 are coupled to a capacitive sense circuit 114. A capacitance across these two inputs 110, 112 corresponds to the capacitance between the electrodes 22, 24 and is influenced by the presence of a wafer. These two inputs are coupled to an operational amplifier 120 within an integrated circuit 122. The integrated circuit is a commercially available circuit designated LF 356 and can be obtained from National Semiconductor.

The operational amplifier 120 generates an output which oscillates with a frequency directly related to the capacitance between the inputs 110, 112.

The oscillating output signal from the operational amplifier 120 varies between ±9 volts. This signal is rectified and shaped, and then coupled to a comparator amplifier 130 having a reference input 132 defined by a zener diode 134 at 3 volts. The comparator amplifier 130 creates a square wave signal output having a fixed 10 microseconds ON period that its frequency varies depending on the sensed capacitance. For a 4-inch circular diameter wafer, this period is approximately 20 microseconds with no wafer in place, 30 microseconds with a wafer placed on the layer 20, and 40 microseconds with the wafer properly secured in place on the support by application of a clamping voltage (approximately 3 kilovolts) to the electrodes by the power supply 44 In the event application of the 3 kilovolt clamping voltage does not sufficiently increase the capacitance between the electrodes 22,24 the signal output from the comparator will have a period less than 40 microseconds.

An output from the comparator amplifier 130 turns on and off light-emitting diodes 140, 142 which are optoisolated from corresponding photodetectors. A top photodetector 144 is used for diagnostic purposes and an output 148 from the detector 144 can be coupled to an oscilloscope, for example, for monitoring frequency changes with capacitance.

Figure 4A:
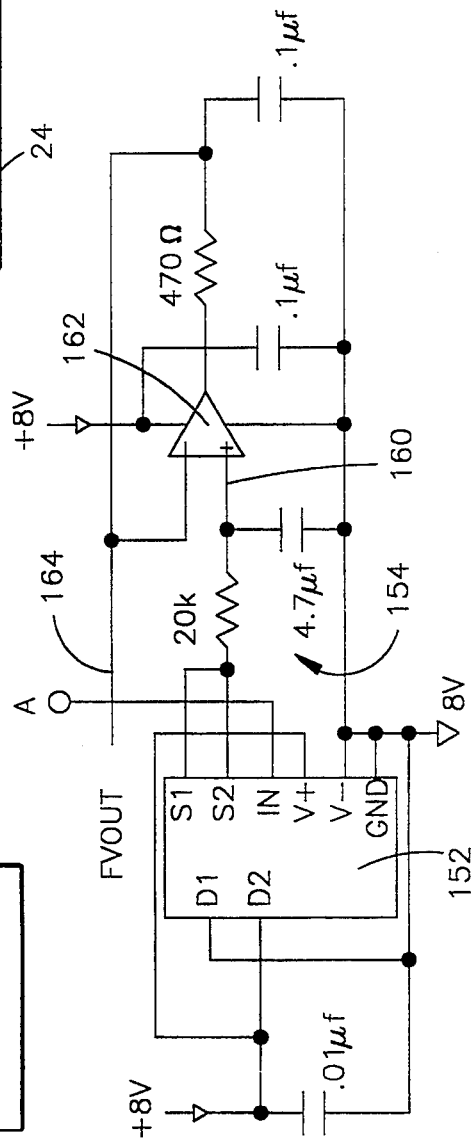
FIGS. 4 and 4A are schematics of a capacitance sensing circuit.

A second photodetector 146 generates a signal which turns on and off a transistor 150 which is coupled to an analog switch 152 (FIG. 4A). This analog switch 152 has in input (IN) coupled to the collector of the transistor 150. As the transistor turns on and off, outputs (S1, S2) of the switch 152 sequentially change state from ground to 8 volts in accordance with the square wave frequency output from the comparator 130.

The output from the analog switch 152 is integrated by a resistor, capacitor circuit 154 so that the input to a non-inverting input 160 of an operational amplifier 162 is a voltage level directly related to the capacitance sensed by the circuit 114. This operational amplifier 162 operates as a voltage follower so that an output 164 designated FVOUT is a DC output signal directly related to sensed capacitance. This DC output signal is used by an implanter control system 250 (FIG. 6) to monitor performance of the system. The wafer handler for depositing a wafer onto the chuck is activated in response to an appropriate no wafer condition being sensed. Once the wafer is sensed, an output from the control circuit 250 activates the DC power supply 44 to energize the electrodes 22, 24 causing an electrostatic attraction between the clamp and the wafer.

Figure 4:
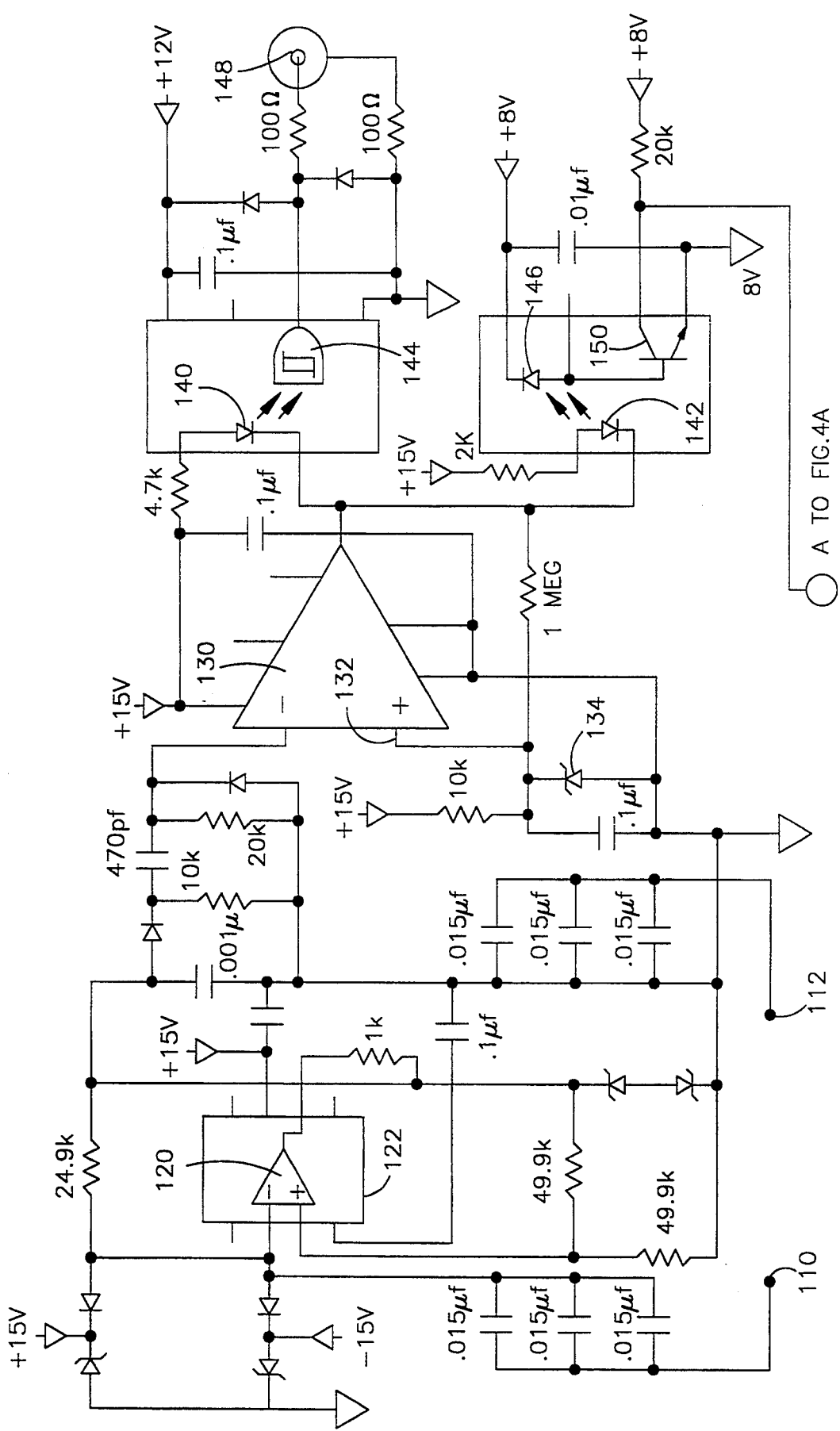
Figure 5:
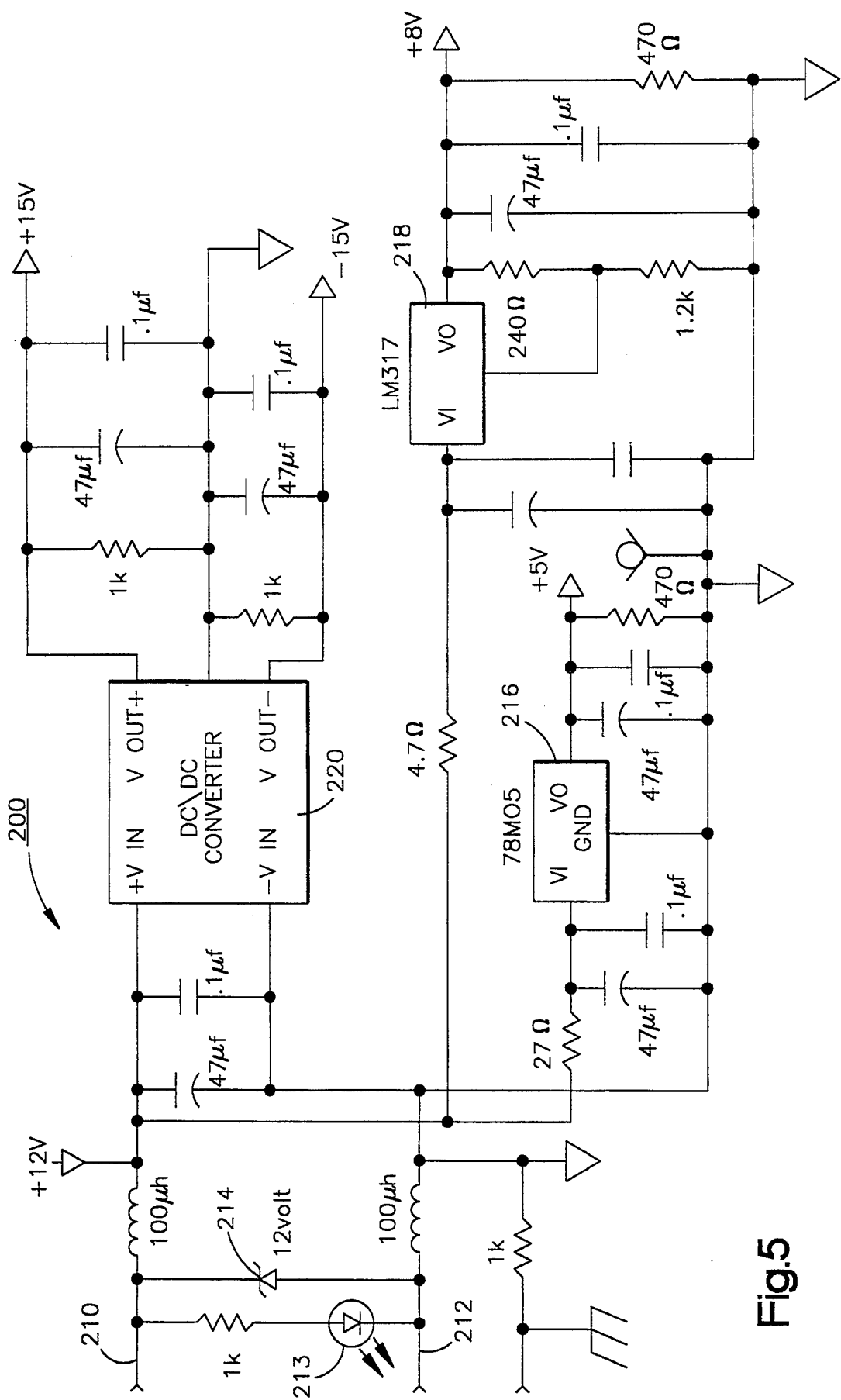
FIG. 5 is a power supply circuit for energizing the sensing circuit of FIGS. 4 and 4A.

Turning to FIG. 5, this figure discloses a power supply circuit 200 for generating voltages appropriate for the capacitance monitoring circuit 114. Two inputs 210, 212 at the left of FIG. 5 provide a 12-volt which energizes a light-emitting diode 213. The 12-volt signal is then coupled to integrated circuit voltage regulators 216, 218 for producing +8 and +5 volts. A DC to DC converter 220 provides plus and minus 15-volt signals. These voltages are applied to the circuitry of FIGS. 4, 4A for providing the capacitance monitoring capability of the present invention.

Operation

In operation, a wafer 12, which is to be held within an ion beam for processing, is placed upon the surface of the layer 20, and the supply 44 will be energized to apply an electrostatic attractive force between the wafer and the layer 20 sufficient to maintain the wafer in position on the chuck. The chuck 10 can then be both rotated and translated to bring the wafer into the ion implantation path of the ion beam.

The implanter control system 250 (FIG. 6) has a large number of device interfaces which receive inputs from sensors 252 (for example, gauges measuring pressures, voltmeters, encoders measuring mechanical position, and the FVOUT output 164), and send operating commands to mechanical and electrical components 254 (for example, valves, power supplies, robots, and the electrostatic clamp power supply 44).

Within the control system there are programmed a variety of cross checks which must be performed before sending an operating command (for example, the valve to a cryopump cannot be opened unless it is verified that the chamber is already under rough vacuum). The output 164 indicates the wafer's presence and whether it is clamped and provides critical information for these cross checks to implement wafer handling and implantation operations. For example, the assembly 10 would not be rotated into a vertical position unless the wafer was verified to be securely clamped. Similarly, the clamp would not be activated unless the wafer's presence on the clamp was verified. When a critical cross check fails, the control system 250 has the ability to place the implanter into HOLD (suspend further operation) in order to avoid damage to the machine or to produce wafers.

A second function of the series of cross checks is to provide an operator interface 260 information about machine status. Specifically, when a cross check fails, an alarm message is generated for display on an operator interface screen, and is recorded in a data log maintained on a disk drive. This information permits an operator to take corrective action to restore normal machine operation.

Figure 6:
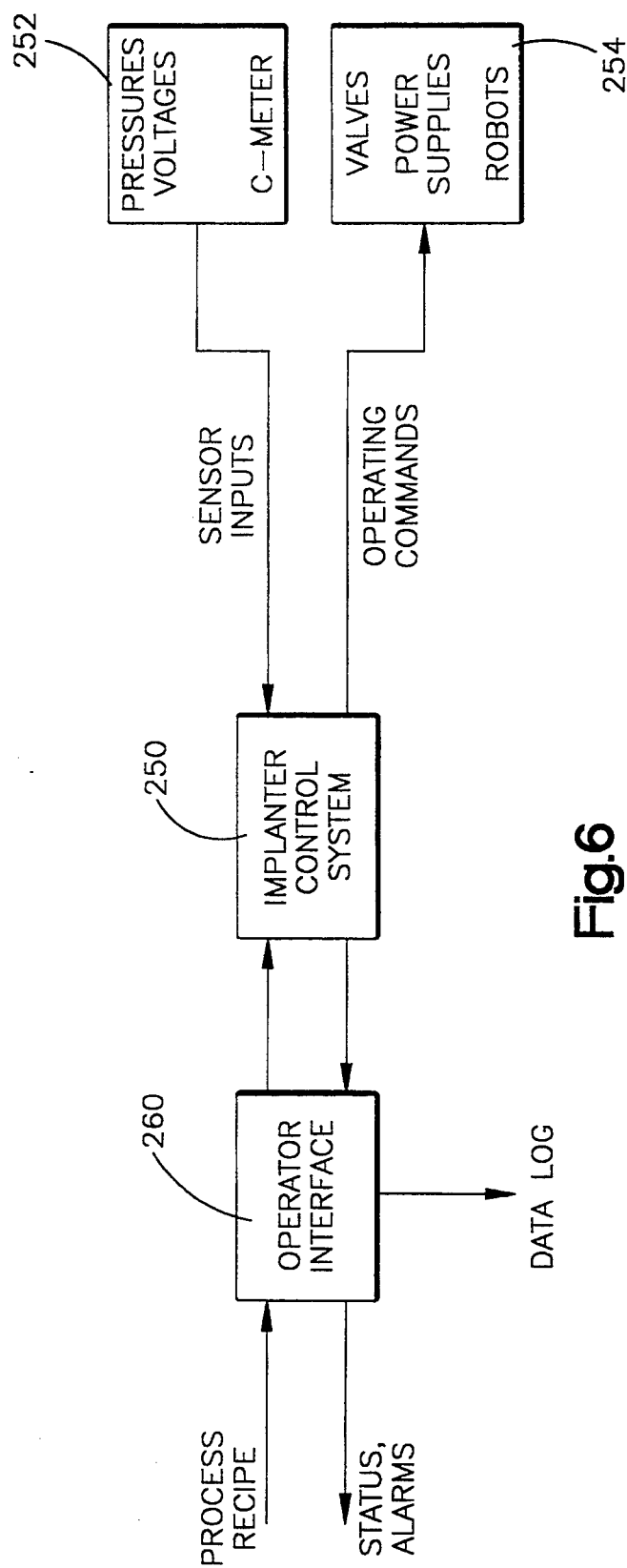
FIG. 6 is a schematic of a control system that utilizes an output of the capacitance sensing circuit of FIGS. 4 and 4A to control an ion implanter.

FIG. 6 represents current state-of-the-art for equipment of this type, and the addition of the capacitive sensing circuit 114 represents an advance in the quality of information available about the status of the wafer on the clamp 10.

While the preferred embodiment of the invention has been described with a degree of particularity, it is the intent that the invention include all modifications and alterations from the disclosed design falling within the spirit or scope of the appended claims.

We claim:

1. Apparatus for securing a semiconductor wafer to a wafer support comprising:
   a) a wafer support including spaced electrodes for attracting wafers to the wafer support by means of an electrostatic attraction between the wafer support and wafers placed onto the wafer support;
   b) capacitive sensing circuitry coupled to the spaced electrodes for monitoring a capacitance and producing an output signal related to said capacitance;
   c) a power supply for energizing the two electrodes; and
   d) a controller to apply energization signals from the power supply to the two electrodes, thereby attracting the wafer to the wafer support once a wafer has been placed onto the wafer support;
   e) said controller including an input coupled to an output from the capacitive sensing circuitry corresponding to a sensed capacitance indicating a presence of the wafer on the wafer support and having an output for initiating one or more processing steps based upon a change in the output from the capacitive sensing circuit indicating the wafer is properly secured to the wafer support.

2. A method for controlling ion implantation of a semiconductor wafer that is electrostatically attracted to a wafer support prior to implantation comprising the steps of:
   a) sensing placement of a semiconductor wafer on a wafer support by providing a capacitance signal related to a capacitance between two electrodes attached to the support and determining if the capacitance signal indicates a wafer has been placed onto the support;
   b) once the capacitance signal related to the capacitance between the two electrodes reaches a value indicating a wafer has been placed on the support, securing the wafer to the support by energizing the two electrodes to create an electrostatic attraction between the wafer and the support;
   c) monitoring a change in the capacitance signal related to the capacitance between the two electrodes as the electrostatic attraction is created to assure the wafer has been properly secured to the support by the electrostatic attraction; and
   d) in the event the capacitance signal does not reach a value indicating the wafer has been properly secured to the support, suspending ion implantation of the wafer.

3. The method of claim 1 wherein the step of securing the wafer is accomplished by applying a direct current voltage between the two electrodes.

4. The method of claim 1 wherein the monitoring step includes a substep of generating a warning message and suspending movement of the wafer support to an implant position if proper securement of the wafer to the support is not sensed.

5. The method of claim 1 wherein the step of providing a capacitance signal is performed by creating a direct current signal related to the capacitance between the two electrodes.

6. Ion implantation apparatus for securing a semiconductor wafer to a wafer support comprising:
   a) a wafer support including two electrodes for attracting wafers to the wafer support by means of an electrostatic attraction;
   b) capacitive sensing circuitry electrically coupled to the electrodes for generating an indicating signal corresponding to a capacitance between the two electrodes;
   c) a power supply coupled to the two electrodes for providing an energizing signal to the two electrodes; and
   d) a controller coupled to the power supply for causing the power supply to energize the two electrodes, thereby attracting the wafer to the wafer support once a wafer has been placed into the wafer support;
   e) said controller including an input coupled to the capacitive sensing circuitry for receipt of the indicating signal corresponding to a sensed capacitance for determining if a wafer is on the wafer support and for determining if the wafer is properly secured to the wafer support and further including means for initiating ion implantation of the semiconductor wafer after the indicating signal indicates the wafer has been properly secured to the wafer support.

7. The apparatus of claim 6 further comprising robotic means coupled to the controller for re-orienting the wafer support and moving said wafer into an ion implant orientation, said controller including means for de-activating the robotic means if the indicating signal indicates that the wafer is not properly secured to the wafer support.

8. An electrostatic chuck for semiconductor wafers comprising:
   a) a first dielectric layer engageable by said wafer during ion implantation of said wafer;
   b) a base member supporting said first dielectric layer;

c) first and second electrodes positioned between said first dielectric layer and said base member;

d) power supply means for applying an electric potential to said first and second electrodes to create an electrostatic attractive force between said first dielectric layer and said wafer, said attractive force being substantially uniformly distributed across the surface of the wafer;

e) capacitance sensing circuitry for sensing a capacitance between the first and second electrodes comprising:

i) an oscillator circuit having first and second inputs connected to the first and second electrodes for providing an oscillator output whose frequency changes as the capacitance between electrodes changes; and ii) output circuitry for converting the frequency to an indicating signal; and f) a controller coupled to the capacitive sensing circuitry for monitoring the indicating signal and causing the power supply to electrostatically attract a wafer to the first dielectric layer after the indicating signal reaches a first level and for initiating wafer processing steps after the power supply has properly secured the wafer to the first dielectric layer as indicated by the indicating signal reaching a second level.

9. The electrostatic chuck of claim 7 wherein the means for sensing further comprises an integrator circuit coupled to the oscillator circuit for converting the frequency signal to a voltage level.

* * * * *